United States Patent [19]

Stouppe

[11] Patent Number: 5,662,771
[45] Date of Patent: Sep. 2, 1997

[54] SURFACE MICROMACHINING PROCESS

[75] Inventor: Rosario C. Stouppe, Lawrence, Mass.

[73] Assignee: Analog Devices, Inc., Norwood, Mass.

[21] Appl. No.: 347,701

[22] Filed: Dec. 1, 1994

[51] Int. Cl.$^6$ .................. H01G 7/00; B44C 1/22
[52] U.S. Cl. .............. 438/52; 29/25.41; 438/619; 438/666
[58] Field of Search .............. 156/644.1, 629.1, 156/653.1, 657.1, 655.1; 430/324, 319; 361/287, 321.1; 73/510, 724; 29/25.41

[56] References Cited

U.S. PATENT DOCUMENTS

| | | | |
|---|---|---|---|
| 5,025,346 | 6/1991 | Taug et al. | 361/283 |
| 5,189,777 | 3/1993 | Guckel et al. | 29/424 |
| 5,337,606 | 8/1994 | Bennett et al. | 73/517 |

*Primary Examiner*—Thorl Chea
*Attorney, Agent, or Firm*—Hale and Dorr LLP

[57] ABSTRACT

A method for making micromachined structures that includes pinpoint polysilicon bumps for eliminating the stiction problem associated with elements of the micromachined structure, such as movable or fixed beams. The pinpoint polysilicon bumps provide a reduced contact area for the beam which reduces the chances that there will be a stiction problem due to static or surface charge. The method takes advantage of an edge alignment technique to achieve a geometry for pinpoint bump structures of as low as 0.20 µm. The bump structures are located in a region of the movable and fixed beams at the edge adjacent the gaps between the interleaved fingers. The method forms bump structures that have a circular design. The formation of the bump structures is carefully controlled with respect to the overlap of these bump structures into interdigitated structures.

8 Claims, 4 Drawing Sheets

SURFACE MICROMACHINING PROCESS

FIELD OF THE INVENTION

The present invention generally relates to processes that are used for creating micromachined structures. More specifically, the present invention relates to processes for forming micromachined structures that have at least one member that is meant to be spaced away from a substrate.

BACKGROUND OF THE INVENTION

In the construction of micromachined structures on a substrate, there are situations in which the structure has one or more members, such as beams, that are meant to spaced away from the substrate. For example, there are accelerometers that employ micromachined polysilicon structures as sensors to detect and measure acceleration. These sensors operate on the basis of changes in the differential capacitance of the sensor caused by the change in the relationship of sensor elements, such as the changes in the relationship of a movable beam with respect to two fixed beams (or plates).

To maximize the capacitance, the movable beam may contain numerous fingers that are interleaved between fingers of the two fixed beams. In the initial state, each finger of the movable beam is positioned midway between the fingers of two fixed beams so that one capacitor is formed by the finger of one fixed beam and the finger of the movable beam and a second (and equal) capacitor is formed by the other fixed beam and the same finger of the movable beam. Various shapes and arrangements of these elements have been used for the accelerometer sensor.

The application of a force along a sensitive axis of the accelerometer causes the fingers of the movable beam to move relative to the fingers of the fixed beams, causing a change in the capacitance, and a signal appears on the movable beam that reflects this amount of acceleration. Thus, for proper operation of the accelerometer, the movable beam must be free to move in response to accelerations experienced by the accelerometer.

"Stiction" or adhesion with respect to microstructures occurs when an element, such as a movable beam, becomes stuck to the substrate. Once a beam is stuck, it renders the sensor virtually useless. The cause of stiction can range from static to surface charge. It has been a challenge for microstructure designers and fabricators to overcome the stiction problem.

Referring to FIG. 1, a top view of a prior art accelerometer is shown generally at 100. The accelerometer has substrate 102 to which a micromachined sensor structure is attached. The sensor structure has fixed beams 104 and 106, and movable beam 108. Fixed beam 104 includes fixed fingers 110, 112, 122, and 124. Fixed beam 106 includes fixed fingers 114, 116, 118 and 120. Movable beam 108 includes center member 138 that has one end that connects to the middle of perpendicular disposed, elongated end member 139 and the other end that connects to the middle of perpendicular disposed, elongated end member 140. End member 139 is anchored to substrate 102 at 130 and 134, and end member 140 is anchored to substrate 102 at 132 and 136.

Center member 138 has movable fingers 142, 144, and 146 disposed perpendicularly from one side and movable fingers 148, 150, and 152 disposed perpendicularly from the other. The movable fingers are either between the fixed fingers of fixed beams 104 and 106, or adjacent a fixed finger of fixed beam 104 or 106.

The construction of the movable beam allows it to move in directions "A" and "B" under inertial loading. Since the stiffness of end members 139 and 140 may be varied, the amount of acceleration that it takes to deflect the center member 138 a measurable amount can be varied to meet various acceleration loading situations.

Referring to FIGS. 2 and 3, the fixed and movable fingers have a plurality of vertical spacers. The vertical spacers are used to try to overcome the stiction problem. In FIG. 2, movable finger 146 has vertical spacers 184, 186, and 188, and movable finger 144 has vertical spacers 202, 204, and 206. Fixed finger 110 that connects to substrate 102 at 180 has vertical spacers 190, 192, and 194, and fixed finger 120 that connects to substrate 102 at 182 has vertical spacers 196, 198, and 200. As shown in FIG. 3, the vertical spacers extend below the normal bottom of the fixed or movable fingers to perform the spacing function.

The mask that is used for producing the vertical spacers has 4.0 μm wide openings traversing each row of fixed and movable fingers. After etching and a subsequent deposition of material, a finger, such as fixed finger 110, has vertical spacers 190, 192, and 194. The footprint of each vertical spacer is a flat surface that is approximately 4.0 μm×4.0 μm.

The vertical spacers shown in FIGS. 2 and 3, however, do not solve the stiction problem because, at times, the large size of the footprint allows the beam to stick to the substrate. Presently, there is not a method of making vertical spacers small enough to prevent the stiction problem.

The present invention overcomes this and other problems as will be set forth in the remainder of the specification referring to the attached drawings.

SUMMARY OF THE INVENTION

The present invention is a method for making micromachined structures that include pinpoint polysilicon bumps that are for substantially eliminating the stiction problem. The proposed polysilicon bumps that are disposed below a micromachined element have a greatly reduced contact area. Because of this greatly reduced contact area, the chance that there will be stiction due to static or surface charge is minimal.

The process of the present invention takes advantage of an edge alignment technique combined preferably with an isotropic etch method to achieve an overlap geometry for pinpoint bump structures into the sides of the fixed and movable fingers of as low as 0.20 μm. As such, the bump structures are located at the edges of the fingers of the movable and fixed beams adjacent the gaps between the fingers.

The bump structures formed according to the present invention have a circular design. The formation of the bump structures is carefully controlled with respect to the overlap of these bump structures into interdigitated structures.

When the polysilicon material for forming the micromachined structure is deposited and defined, it will form the movable and fixed beams with bump structures that are pinpoints of polysilicon. Each of these bumps structures has a total contact area represented by the pinpoint, which, along with other pinpoints, acts as a vertical stopper to keep the micromachined structure elements, such as the fixed and movable beams, from contacting the substrate.

An object of the present invention is a method for forming polysilicon bump structures on fixed and movable elements of a micromachined structure to substantially eliminate the stiction problems associated with such elements due to static and surface charge.

Another object of the present invention is a method for providing pinpoint polysilicon bump structures for fixed and movable beams of a micromachined structure with each bump having a total contact area represented by a pinpoint.

These and other objects of the present invention will be discussed in detail in the remainder of the specification referring to the attached drawings.

DETAILED DESCRIPTION OF THE DRAWINGS

The present invention is a method for forming pinpoint polysilicon bump structures on at least fixed and movable beams of a micromachined structure to substantially eliminate the stiction problem associated with such micromachined structure elements.

Figure 1:
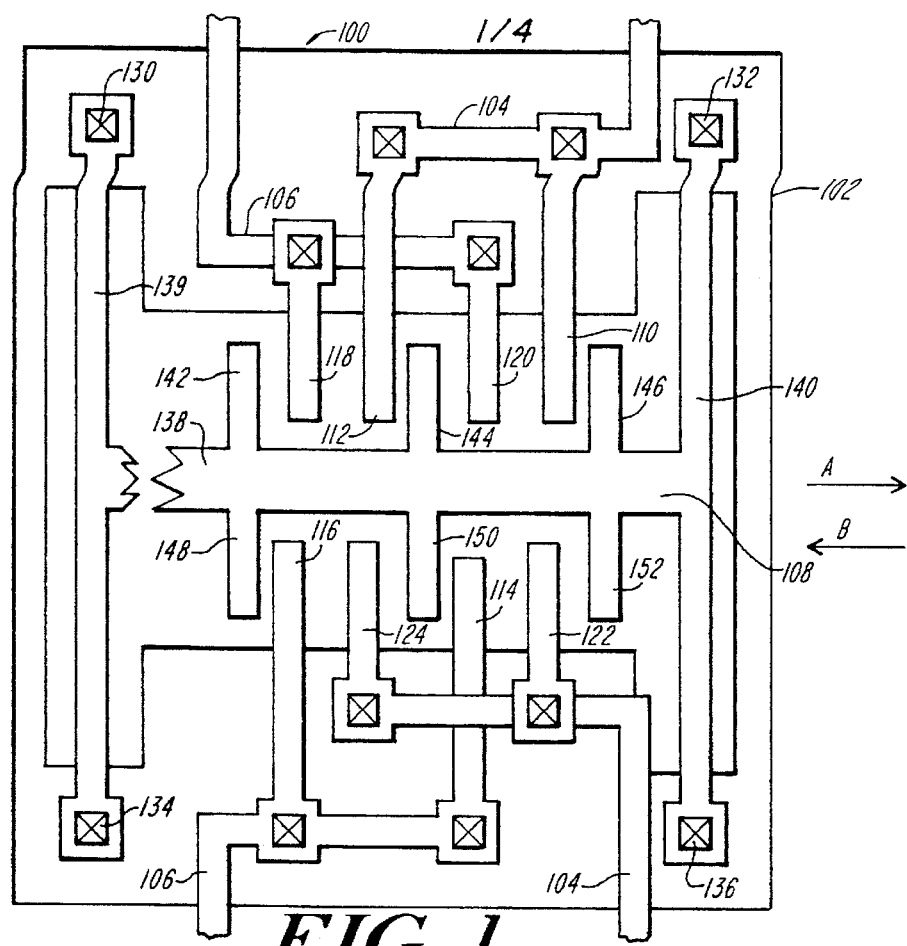
FIG. 1 is a top view of a portion of a prior art micromachined structure that is an accelerometer.

A micromachined structure to which the method of the present invention may be applied is shown in FIG. 1. The method of the present invention is implemented in the fabrication process of micromachined structures. This method will result in pinpoint polysilicon bump structures being formed on micromachined elements, as will be described.

Figure 4:
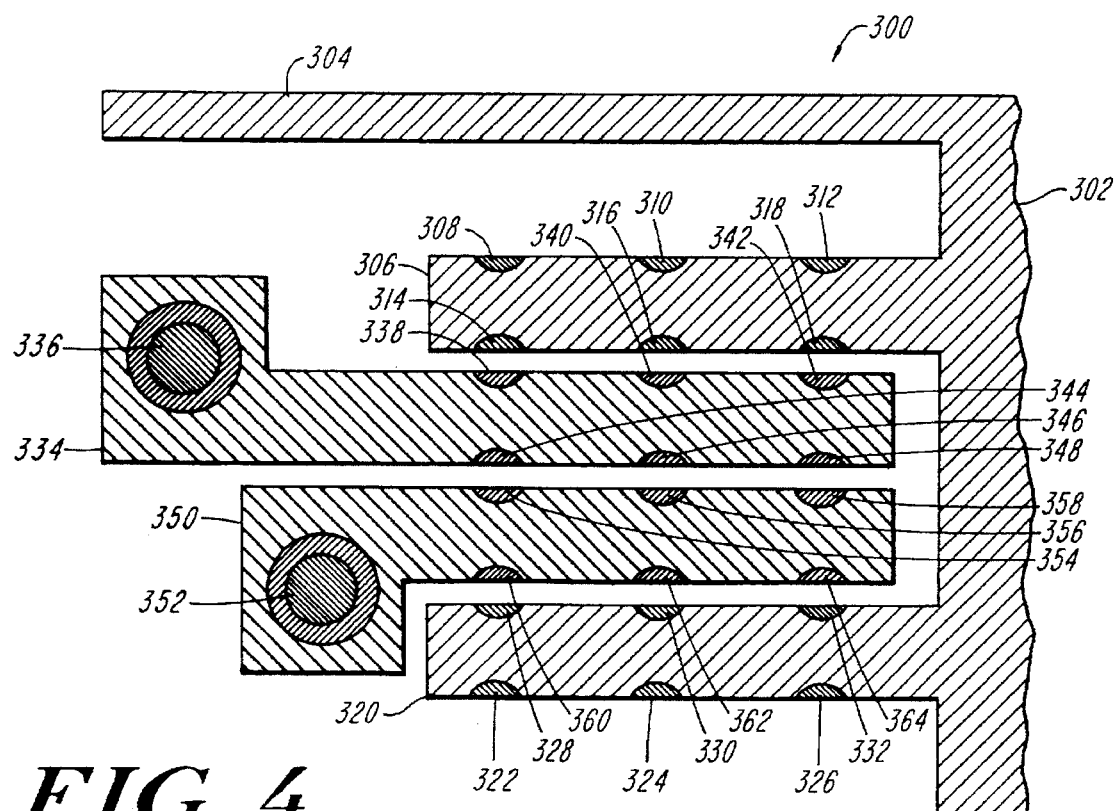
FIG. 4 shows a top view of part of the micromachined structure in which pinpoint polysilicon bump structures made according to the method of the present invention are disposed in the fingers of the fixed and movable beams.

Referring to FIG. 4, part of a micromachined structure constructed using the method of the present invention is shown generally at 300. In this Figure, center member 302 has end member 304 connected to the end shown. Movable fingers 306 and 320 are disposed perpendicularly outward from a side of center member 302.

Fixed fingers 334 and 350 are interleaved between movable fingers 306 and 320. Fixed finger 334 is adjacent to movable finger 306 and connects to the substrate at 336. Fixed finger 350 is adjacent to movable finger 320 and connects to the substrate at 352.

From the top view shown in FIG. 4, the pinpoint polysilicon bump structures appear as semi-circles or partial circles at the side edges of the fixed and movable fingers. Specifically, movable finger 306 has pinpoint polysilicon bump structures 308, 310, and 312 on one side and pinpoint polysilicon bump structures 314, 316, and 318 on the other. Movable finger 320 has pinpoint polysilicon bump structures 328, 330, and 332 on one side and pinpoint polysilicon bump structures 322, 324, and 326 on the other. Similarly, fixed finger 334 has pinpoint polysilicon bump structures 338, 340, and 342 on one side and pinpoint polysilicon bump structures 344, 346, and 348 on the other. Finally, fixed finger 350 has pinpoint polysilicon bump structures 354, 356, and 358 on one side and pinpoint polysilicon bump structures 360, 362, and 364 on the other.

Figure 5:
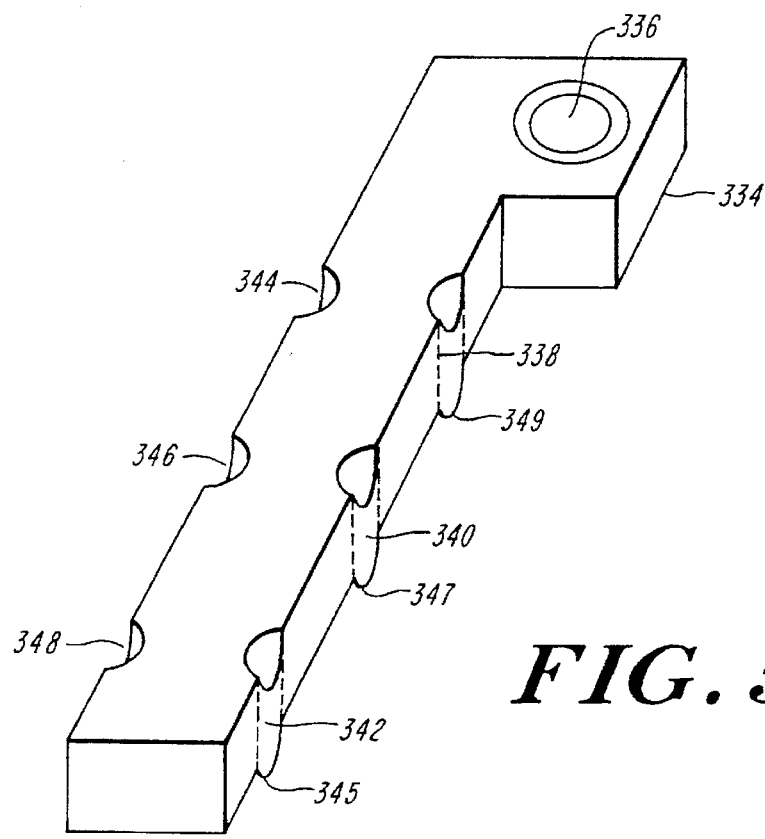
FIG. 5 shows an elevated, perspective view of one of the fixed fingers with pinpoint polysilicon bump structures made according to the method of the present invention.
Figure 6:
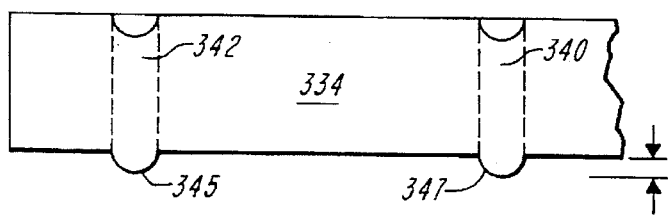
FIG. 6 shows a partial side view of the fixed finger shown in FIG. 5.
Figure 7:
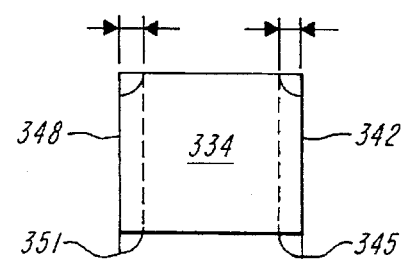
FIG. 7 shows a partial end view of the fixed finger shown in FIG. 5.

FIG. 5 shows an elevated, perspective view of fixed finger 334, FIG. 6 shows a partial side view of fixed finger 334, and FIG. 7 shows a partial end view of fixed finger 334. These Figures provide a more complete view of the bump structures of fixed finger 334. As is readily understood from FIGS. 5–7, the bump structures extend or overlap into the sides of the fixed finger as shown by the dashed lines. Referring particularly to FIGS. 4 and 7, the bump structures are flush with the sides of fixed finger 334. Moreover, the pinpoint tips, such as pinpoint tips 345, 347, 349 and 351, extend beyond the bottom of fixed finger 334. These pinpoint tips form the contact areas that are used to perform the spacing function to overcome the stiction problem.

Figure 8:
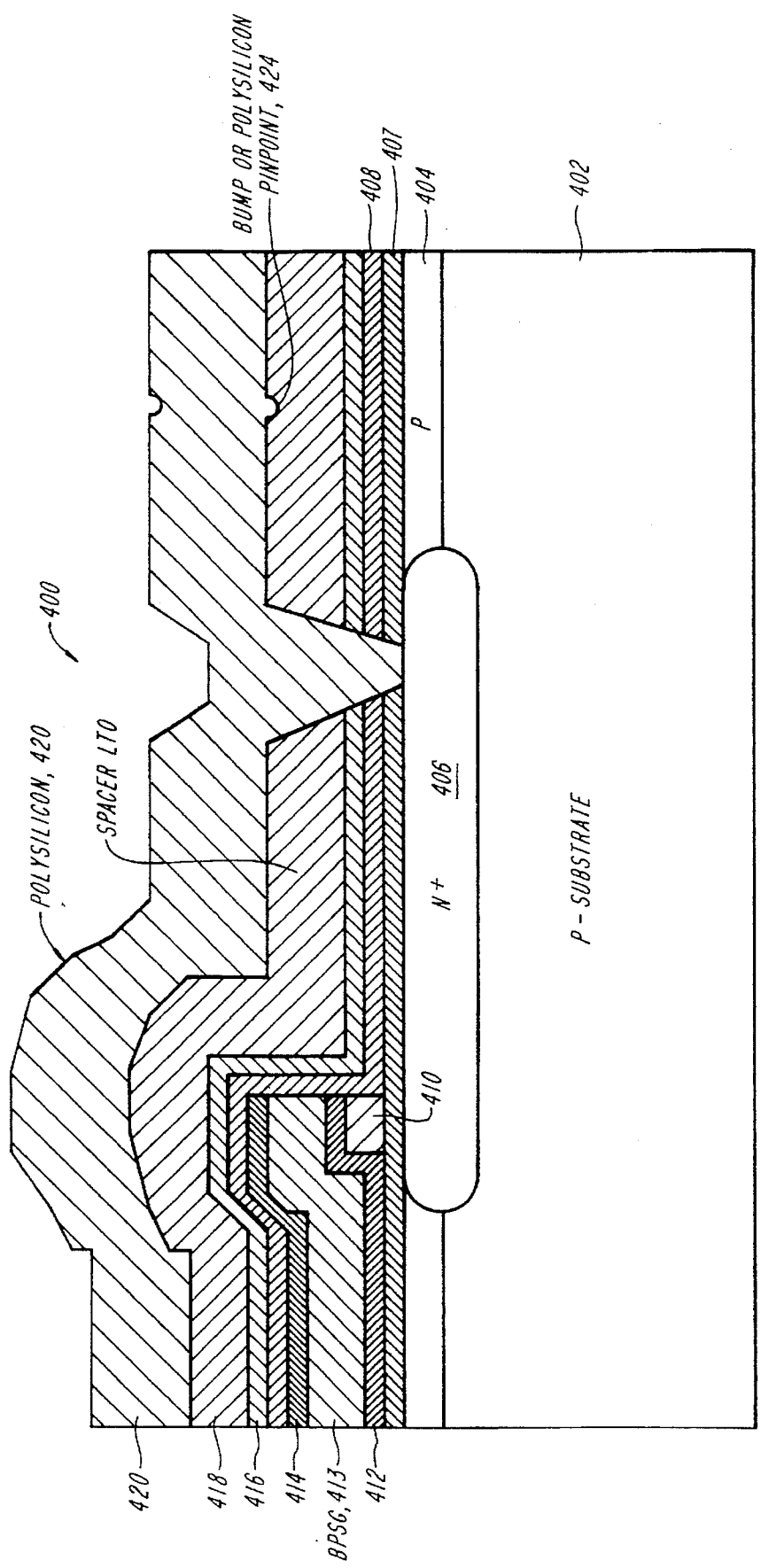
FIG. 8 shows a cross-section of a semiconductor at an intermediate processing stage that will result in the micromachined structure shown in FIGS. 4–7 at the completion of processing.

FIG. 8, generally at 400, shows a cross-section of a semiconductor that has a substrate on which a micromachined structure is formed. The semiconductor shown in FIG. 8 is at an intermediate processing stage. In this Figure, P-substrate 402 has P-layer 404 deposited on it. N+ diffusion 406 is diffused in the P-layer and P-substrate. Gate oxide layer 407 is deposited on P-layer 404.

A circuitry connection structure is disposed at the left side of the semiconductor. It includes nitride partial layer 412, thick boron phosphorus silicon glass ("BPSG") partial layer 413, nitride partial layer 414, and gate polysilicon element 410.

The circuitry connection structure and the remainder of oxide layer 407 are covered by polysilicon layer 408 and then nitride layer 416. Spacer layer 418, which is made of a low temperature oxide ("LTO"), is deposited over nitride layer 416. This layer is used for providing the desired space between the substrate and the micromachined structure. This layer will be removed before final processing. Finally, polysilicon layer 420 is disposed over spacer layer 418. Conventional processing steps are used so that a portion of polysilicon layer 420 contacts N+ diffusion 406 in P-layer 404 and P-substrate 402.

Referring to FIGS. 1 and 4–8, the method of the present invention will be described. After spacer layer 418 has been deposited, the desired pinpoint polysilicon bump structures are formed by using a mask to define 1.6 µm circles in what will be the gap between movable fingers and fixed fingers, such as movable finger 306 and fixed finger 334 or movable finger 320 and fixed finger 350, or between two fixed fingers, such as fixed fingers 334 and 350. The etching process will cause an approximately 0.20 µm undercut around each 1.6 µm circle of the mask. The overlap into the edge of the fingers will range from 0.20 µm to 0.45 µm. Each of the overlap areas will result in a bump structure once final processing is complete.

More specifically, to form the pinpoint polysilicon bump structures, the mask is applied to the top of spacer layer 418. This creates an accurately placed and precise perforation pattern in spacer layer 418, which is 16,000 Å thick. These perforation holes are 1.6 µm in diameter and 2000 Å deep. A representative perforation hole is shown in FIG. 6 at 424.

After the perforation holes are formed in spacer layer 418, polysilicon layer 420 is deposited on top of spacer layer 418. Polysilicon layer 420 will be used to form the micromachined structure.

When polysilicon layer 420 is deposited over spacer layer 418, the polysilicon fills the perforations in spacer layer 418. The material in these holes ultimately will form the bumps at the bottom of polysilicon layer 418. These bumps are what create the pinpoints of polysilicon at the fixed and movable fingers.

The next step of the method of the present invention is to use a "BEAMS" mask or other suitable mask to define the fingers of the micromachined structure, preferably using an isotropic etch method. The interdigitated beams are designed to be on the edges of the bump openings, thereby causing the desired overlap of the bumps. Once the etching of the micromachined structure is complete, the pinpoints of polysilicon are formed under the fingers, such as shown in FIG. 5 at 345, 347, and 349.

The method of the present invention may be used to produce pinpoint polysilicon bump structures of varying contact areas as shown in Table 1.

TABLE 1

| Circle Diameter (μm) | Overlap (μm) | Total Contact Area (μm²) | Prior Art Total Contact Area of 4 μm × 4 μm pad (μm²) | Area Ratio |
|---|---|---|---|---|
| 1.6 | 0.45 | 0.201 | 16.0 | 79.7 |
| 1.6 | 0.40 | 0.145 | 16.0 | 110.3 |
| 1.6 | 0.35 | 0.095 | 16.0 | 168.1 |
| 1.6 | 0.30 | 0.052 | 16.0 | 305.8 |
| 1.6 | 0.20 | substantially a point | 16.0 | ∞ |

Figure 2:
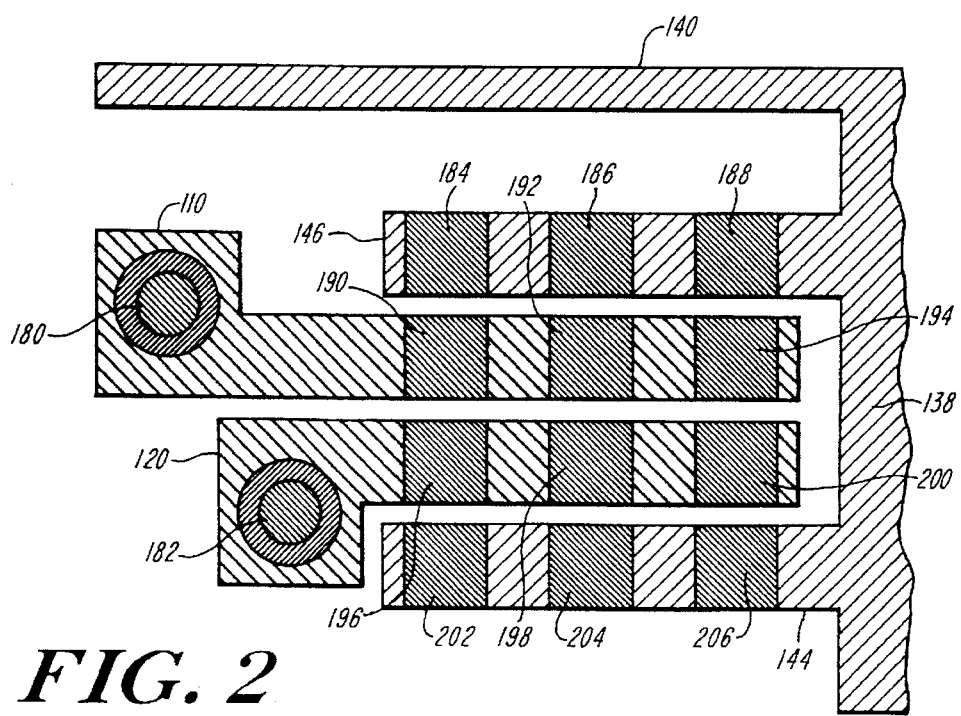
FIG. 2 shows a top view of part of the micromachined accelerometer shown in FIG. 1 which shows the prior art spacers in fingers of the fixed and movable beams.
Figure 3:
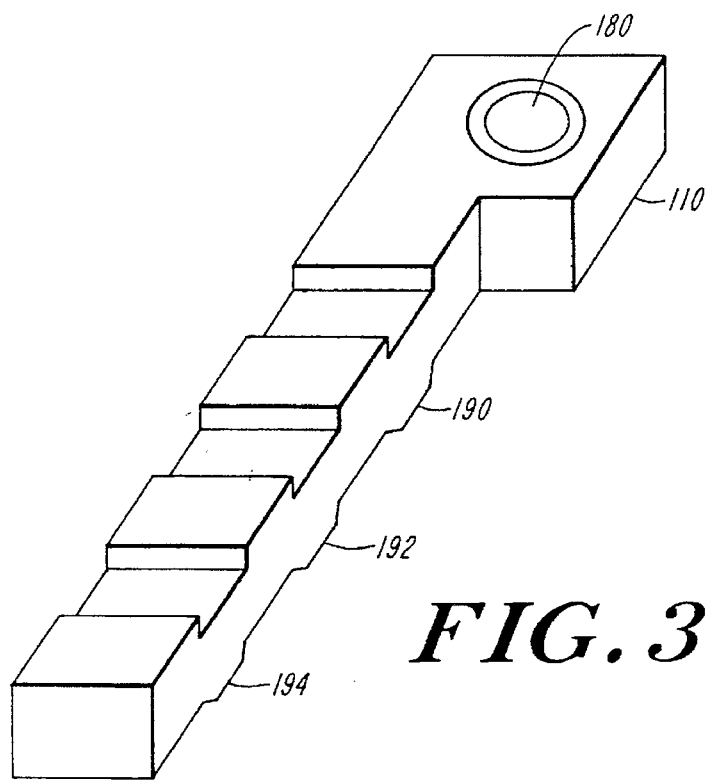
FIG. 3 shows an elevated, perspective view of one of the fixed fingers that includes prior art spacers.

In Table 1, Total Contact Area is the area of a pinpoint polysilicon bump structure that will contact the substrate. Area Ratio is the ratio of the bottom area of a standard square vertical spacer (see FIGS. 2 and 3) to the contact area of the bumps made according to the present invention (see FIGS. 4–7). The Area Ratio figures demonstrate the greatly reduced total contact area provided by the bump structures made according to the present invention which overcome the stiction problem. Therefore, the contact area of the bump structures, which range from substantially a point to 0.201 μm², is all that will contact the substrate.

The terms and expressions that are used herein are terms of expression and not of limitation. There is no intention in the use of such terms and expressions of excluding the equivalents of the features shown and described, or portions thereof, it being recognized that various modifications are possible in the scope of the invention.

I claim:

1. A method for forming polysilicon pinpoint members on micromachined polysilicon structures, comprising the steps of:

forming at least a first layer of material on a substrate;

forming a spacer layer of material on the first layer of material;

forming a pattern of holes in the spacer layer with each hole having a diameter and depth;

forming a microstructure polysilicon layer on the spacer layer such that microstructure polysilicon material fills the pattern of holes in the spacer layer;

forming a micromachined polysilicon structure from the microstructure polysilicon layer and removing the spacer layer to expose a pattern of polysilicon pinpoint members formed by the microstructure polysilicon material in the pattern of holes in the spacer layer.

2. The method as recited in claim 1, wherein the pattern of holes in the spacer material is formed by a mask.

3. The method as recited in claim 2, wherein the holes have a 1.6μ diameter.

4. The method as recited in claim 2, wherein the holes have a 2000 Å depth.

5. The method as recited in claim 1, wherein the micromachined polysilicon structure is formed by a mask.

6. The method as recited in claim 5, wherein the polysilicon pinpoint members are formed at edges of the micromachined polysilicon structure.

7. The method as recited in claim 6, wherein each of the polysilicon pinpoint members has a contact area beneath the micromachined polysilicon structure that ranges from substantially a point to approximately 0.201 μm².

8. The method as recited in claim 5, wherein an overlap of edges of the micromachined polysilicon structure ranges from 0.20 μm to 0.45 μm.

* * * * *